United States Patent
Haigis

[11] Patent Number: 5,936,447
[45] Date of Patent: Aug. 10, 1999

[54] POWER-UP INPUT BIAS CIRCUIT AND METHOD

[75] Inventor: John Edward Haigis, Sherman, Tex.

[73] Assignee: Texas Instruments Incorporated, Dallas, Tex.

[21] Appl. No.: 08/999,122

[22] Filed: Dec. 29, 1997

Related U.S. Application Data

[60] Provisional application No. 60/035,724, Jan. 2, 1997.
[51] Int. Cl.⁶ .................................................. H03K 17/22
[52] U.S. Cl. .......................... 327/198; 327/143; 327/546
[58] Field of Search .................................... 327/198, 143, 327/142, 538, 545, 546

[56] References Cited

U.S. PATENT DOCUMENTS

| | | | |
|---|---|---|---|
| 5,638,330 | 6/1997 | Confalonieri et al. | 327/143 |
| 5,703,475 | 12/1997 | Lee et al. | 327/538 |
| 5,734,280 | 3/1998 | Sato | 327/198 |

*Primary Examiner*—Timothy P. Callahan
*Assistant Examiner*—Terry L. Englund
*Attorney, Agent, or Firm*—W. James Brady, III; James Brady; Richard L. Donaldson

[57] ABSTRACT

A circuit and method biases signal pins, such as the output enable pin and other input pins, of an integrated circuit to a predetermined level during power-up of the integrated circuit. The circuit can be incorporated into the chip-level design of the integrated circuit, such as a CMOS device. The circuit has a pull-up/pull-down biasing section, a sensing section, and a latch section to bias the output enable signal to a disabled or inactive level during power-up. A bus hold section can additionally be provided to bias the other input pins of the integrated circuit to a fixed, solid logic level during power up. When an external output enable input is applied to activate the output enable pin, the circuit releases the bias applied to the output enable pins and the other input pins.

11 Claims, 3 Drawing Sheets

POWER-UP INPUT BIAS CIRCUIT AND METHOD

This application claims priority under 35 USC § 119(e)(1) of provisional application number 60/035,724 filed Jan. 2, 1997.

CROSS REFERENCE TO RELATED APPLICATION

This patent application is related to the following co-pending, commonly assigned U.S. patent applications, the disclosures of which are expressly and specifically incorporated herein by reference in their entirety: "ULTRA LOW CURRENT POWER-UP SIGNAL SWITCHING CIRCUIT", by John E. Haigis and Thomas V. McCaughey, filed Apr. 8, 1996, Ser. No. 60/015,207 "and 'ULTRA LOW CURRENT POWER-UP SIGNAL SWITCHING CIRCUIT', by John E. Haigis and Thomas V. McCaughey, filed Apr. 8, 1997, Ser. No. 08/838,341" after "60/015,207".

BACKGROUND OF THE INVENTION

1. Field of the Invention

The present invention relates to, in general, electronic circuitry for biasing signals. More specifically, the present invention relates to a circuit for pre-biasing the input pins of an integrated circuit during initialization of the integrated circuit.

2. Relevant Background

Integrated circuits having multiple pins for connections to external signals often require that these pins be externally biased to ensure proper operation of the integrated circuit. For example, the input pins for a CMOS device should be externally biased to a solid high or low logic level, away from the threshold regions, in order to prevent possible device oscillation and damaging supply-currents through the CMOS device.

Many integrated circuits also provide output signals connected to a bus of signals, such as an address bus or a data bus. These signal buses may be connected to multiple other devices or circuits. In order to preserve the integrity of the signal bus, any device connected to the signal bus should not access the bus (i.e., output a signal to the bus) at any improper time.

Integrated circuits conventionally have an output enable pin or control line which controls the drivers of the output pins of the integrated circuit. When the output enable control line is externally asserted, the output drivers of the integrated circuit are correspondingly enabled such that data appears on the output pins of the integrated circuit. When the output enable control line is disabled, the output pins of the integrated circuit are placed in a tri-state or high-impedance mode such that any signal line or bus to which the output pins are connected are unaffected thereby. In the high-impedance mode, the output pins of the integrated circuit essentially disconnect from any signal lines to which they are physically coupled.

For these reasons, the input pins of an integrated circuit should be biased and the output enable control line should be disabled while power is being applied to the integrated circuit. The biasing of the input pins and the output enable control line has traditionally been achieved through the use of components external to the integrated circuit. These components generally include pull-up or pull-down resistors and diodes which consume circuit board space, possibly conduct noise into the integrated circuit, and can add expense to the overall circuit design.

What is needed is an on-chip circuit for biasing the output enable control line and the other input pins of an integrated circuit during power-up conditions.

SUMMARY OF THE INVENTION

In accordance with this invention, the above problems have been solved by a circuit for biasing a signal pin, such as the output enable pin, of an integrated circuit to a predetermined logic level during power-up. The biasing circuit has a biasing section, a sensing section, and a latch section. The biasing section is coupled to the signal pin and connects the signal pin to a supply signal, such as VCC or ground, of the integrated circuit so that the signal level of the signal pin approaches the predetermined logic low or high level. The sensing section is coupled to the signal pin for sensing the signal level of the signal pin. The latch section, coupled to the biasing section and the sensing section, controls the biasing section in response to the signal level of the signal pin.

The biasing section further has a first and a second current capacity mode. The first mode processes a first current level between the signal pin and the biasing section as the signal level of the signal pin approaches the predetermined logic level. The second mode processes a second current level between the signal pin and the biasing section after the supply signal, VCC, has reached the predetermined voltage level. These two current capacity modes will permit the circuit to efficiently establish and maintain the bias on the signal pin, such as the output enable pin.

In one embodiment of the invention, the biasing section is comprised of a pair of switching elements, such as transistors, connected in parallel to the supply signal to bias an active-low output enable signal. In another embodiment of the invention, the biasing section is comprised of a pair of switching elements, such as transistors, connected in parallel to a ground signal to bias an active-high output enable signal.

The sensing section detects an external signal applied to the signal pin and directs the latch section to release the signal pin from the supply signal through the biasing section.

A bus hold section coupled to the latch section is also provided. The bus hold section applies a fixed logic signal level to other input pins of the integrated circuit until the sensing section detects an external signal applied to the output enable pin.

In a method implementation of the invention, a method is provided for biasing a signal pin of an integrated circuit to a predetermined logic level during power-up. A connecting step connects the signal pin, such as an output enable pin, to a supply signal of the integrated circuit so that the signal level of the signal pin approaches the predetermined logic level. A sensing step senses the signal level of the signal pin, and a controlling step controls the connecting step in response to the signal level of the signal pin sensed by the sensing step.

The connecting step can further comprise firstly coupling the supply pin through a first switching element for processing a first current level between the signal pin and the biasing section as the signal level of the signal pin approaches the predetermined logic level. A second coupling step connects the supply pin through a second switching element for processing a second current level between the signal pin and the biasing section after the supply signal, VCC, has reached the predetermined voltage level. These two coupling steps will permit efficient establishment and maintenance of the bias on the signal pin, such as the output enable pin The method can further comprise providing a power-up reference signal being active when the supply signal reaches a predetermined voltage level, and releasing the signal pin from the supply signal of the integrated circuit after the power-up reference signal is active and an external signal is applied to the signal pin as sensed by the sensing step. In this manner, the biasing method disclosed herein will not affect the integrated circuit after the device has been powered-up and an external output enable signal has been applied to the output enable pin.

The great utility of the invention is to permit a user of an integrated circuit to controllably power-up an integrated circuit into a high impedance mode without having to externally bias the output enable control line.

Another utility of the invention is to controllably bias the input pins of an integrated circuit during power-up without any external biasing thereof These and other features, utilities, and advantages of the invention will be apparent to those skilled in the art from the following detailed description of the invention, when read in conjunction with the accompanying drawings and appended claims.

DETAILED DESCRIPTION OF THE PREFERRED EMBODIMENTS

Figure 1:
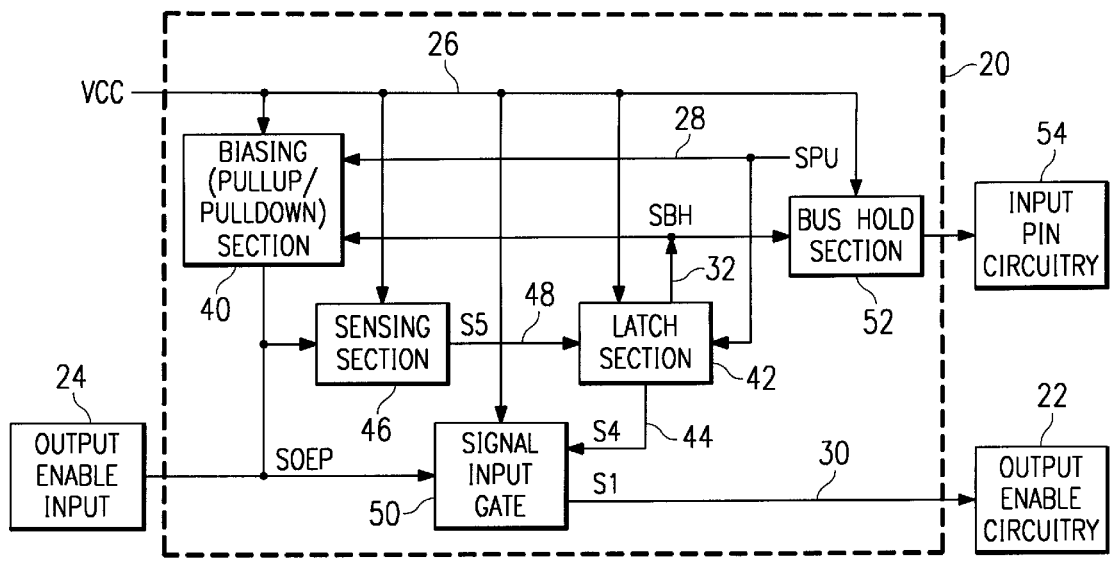
FIG. 1 illustrates a block diagram of the biasing circuit 20 of the present invention for biasing an output enable control line or an input pin of an integrated circuit.

The present invention is a biasing circuit and method which can be used to bias an output enable control line or an input pin of an integrated circuit during initialization or power-up. Referring to FIG. 1, biasing circuit 20 is connected between the output enable pin 24 and the output enable circuitry 22 of an integrated circuit. The biasing circuit can also be connected to the input pin circuitry 54 for biasing thereof Both the output enable circuitry 22 and the input pin circuitry 54 reside internally in a single integrated circuit (not shown). In accordance with the present invention, the biasing circuit 20 can be included as part of the internal chip-level design of the integrated circuit to form a single integrated circuit.

The input signals to biasing circuit 20 include the output enable pin 24, a power supply line (VCC) 26, and a power-up signal (SPU) 28. A detailed explanation of the generation of the SPU signal 28 is provided in the co-pending patent application "ULTRA LOW CURRENT POWER-UP SIGNAL SWITCHING CIRCUIT", incorporated by reference above. In general, the SPU signal 28 is a reference signal corresponding to the level of the VCC signal 26 as the integrated circuit device powers-up. The SPU signal 28 is at a low logic level when VCC is low, and after VCC reaches a predetermined value, the level of the SPU signal 28 switches high, reducing the strength of the biasing circuit and releasing the control of the latch circuit to the sensing circuit.

The biasing circuit 20 has a controlled output enable signal (S1) 30 and a bus hold signal (SBH) 32. The S1 signal 30 is used to controllably drive the output enable circuitry 22 of an integrated circuit. The SBH signal 32 is an active-low signal, and is used to maintain the signal levels initially established by the present invention as well as controlling the bus hold section 52 for biasing other input pins (i.e., data or control inputs) of the integrated circuit, as will be described below.

The biasing circuit 20 of the present invention has a pull-up/pull-down biasing section 40, a latch section 42, and a sensing section 46. The biasing section 40 controllably biases the output enable pin 24 of an integrated circuit to a disabled level. The biasing section 40 can be configured to pull-up an active-low output enable pin 24 or pull-down an active-high output enable pin 24. The biasing section 40 is coupled to the output enable pin 24, VCC signal 26, SPU signal 28, and SBH signal 32.

The latch section 42, coupled to sensing section 46, latches the signal level established by the biasing section 40. The latch section 42 generates the SBH signal 32 coupled to biasing section 40 and to bus hold section 52. The latch section also generates the S4 signal labeled 44 coupled to the signal input gate 50. This S4 signal is a fail-safe signal provided to ensure that the desired signal is produced by the biasing circuit 20.

The sensing section 46 is coupled to the biasing section 40, the output enable pin 24, and the latch section 42. The sensing section 46 detects the signal level of the output enable pin 24, regardless of whether this signal level is controlled by biasing section 40 or by an externally applied signal to the output enable pin 24. Sensing section 46 provides a feedback or sensing signal (S5) 48 to the latch section 42.

Signal input gate 50 accepts the S4 signal 44 from latch section 42, and the input signal from output enable pin 24. Gate 50 also buffers the externally applied input signal and isolates it from the integrated circuit. The S1 output signal 30 from gate 50 provides a controlled output enable signal level to the output enable circuitry 22 of the integrated circuit.

Bus hold section 52, coupled to the SBH signal 32 and input pin circuitry 54, will maintain an input pin (not shown in FIG. 1) of the integrated circuit at a solid logic level during power-up in response to SBH signal 32. The logic levels biasing these inputs is not important since the present invention insures that the output enable circuitry is disabled during power-up. Once an external signal is applied to activate the output enable pin 24, the bus hold section 52 releases its bias on the input pins.

There are three input condition scenarios that could exist during the operation of the biasing circuit 20 at power-up. These scenarios are described with respect to an integrated circuit having an active-low output enable pin 24.

The first condition is when the output enable pin 24 is floating and is not externally biased. During power-up, the pull-up biasing section 40 turns on which biases output enable pin 24 high and the S1 output signal 30, through signal input gate 50, to a low logic level. The SBH signal 32 is then activated so that the bus hold section 52, coupled to other inputs of the device, is enabled.

Depending on the particular implementation of the output enable circuitry 22 shown in FIG. 1, an inverter can be added to invert the S1 signal 30 if necessary.

The sensing section 46 and the latch section 42 will keep the pull-up biasing section 40 turned on until the output enable pin 24 is driven externally to a low logic level. Upon detecting the transition of the signal on the output enable pin 24, the sensing section 46 and the latch section 42 turn off the pull-up biasing section 40 and the SBH signal 32 will disable the bus hold section 52 on the other inputs of the integrated circuit. The latch section 42 maintains the biasing circuit 20 disabled for the remainder of the operation of the integrated circuit so that biasing circuit 20 will not actively influence the output enable circuitry 22 or the input pin circuitry 54 of the integrated circuit until power is removed and reapplied thereto.

The other two input conditions are when the output enable pin 24 is externally biased, either high or low, during power-up. If a high logic level is applied to the output enable pin 24 during power-up, the pull-up biasing section 40 will be turned on and the circuit will operate as described above. Biasing section 40 will remain on until the signal level on the output enable pin 24 is externally switched low.

If a low logic level is applied to the output enable pin 24 during power-up, the pull-up biasing section 40 will source current into the low on the output enable pin 24 until the voltage level on VCC ramps up to a predetermined switching value when SPU signal 28 switches from a low to high logic level. The sensing section 46 and the latch section 42 will then detect and accept the low logic level on output enable pin 24 and correspondingly disable the pull-up biasing section 40. As mentioned above, once the pull-up biasing section 40 is turned off, the biasing circuit 20 of the present invention is securely disabled and the pull-up biasing section 40 will not turn on again for the duration of the operation of the integrated circuit.

Figure 2:
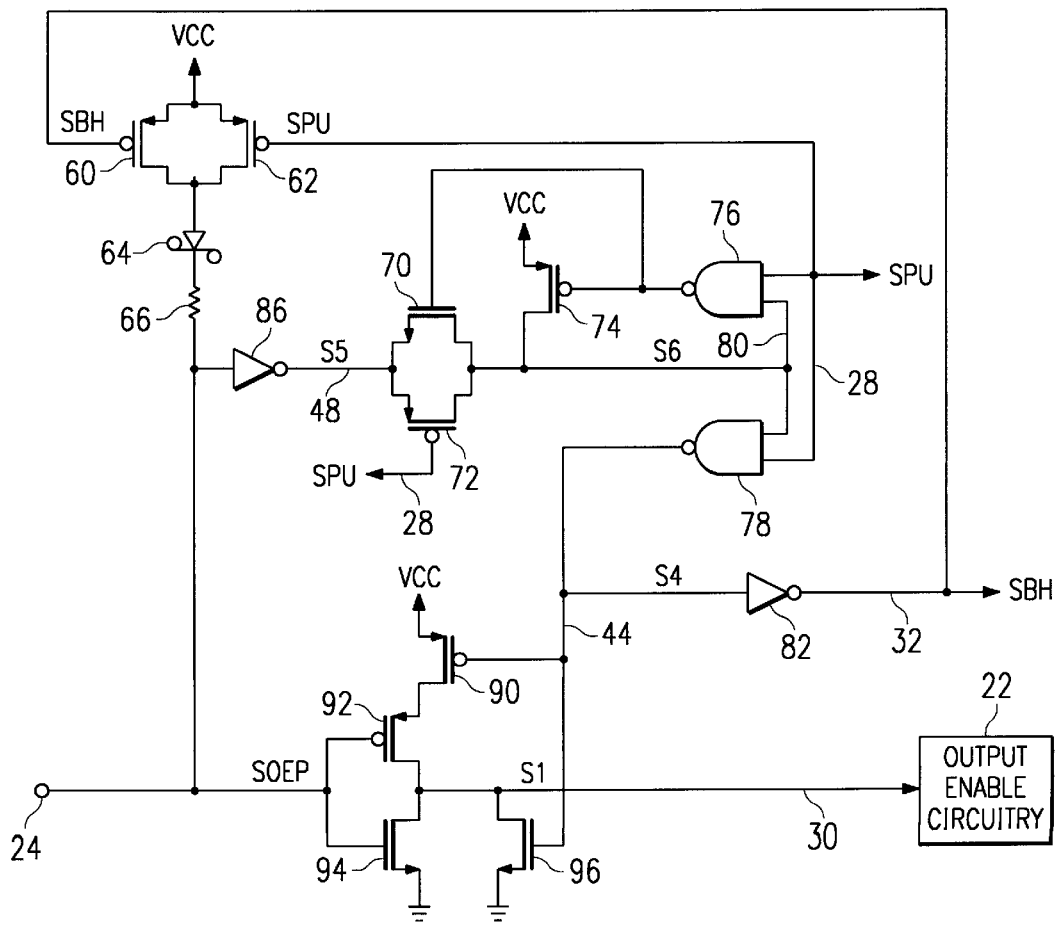
FIG. 2 illustrates a circuit diagram of an embodiment of the invention for biasing an active-low output enable control line.
Figure 4:
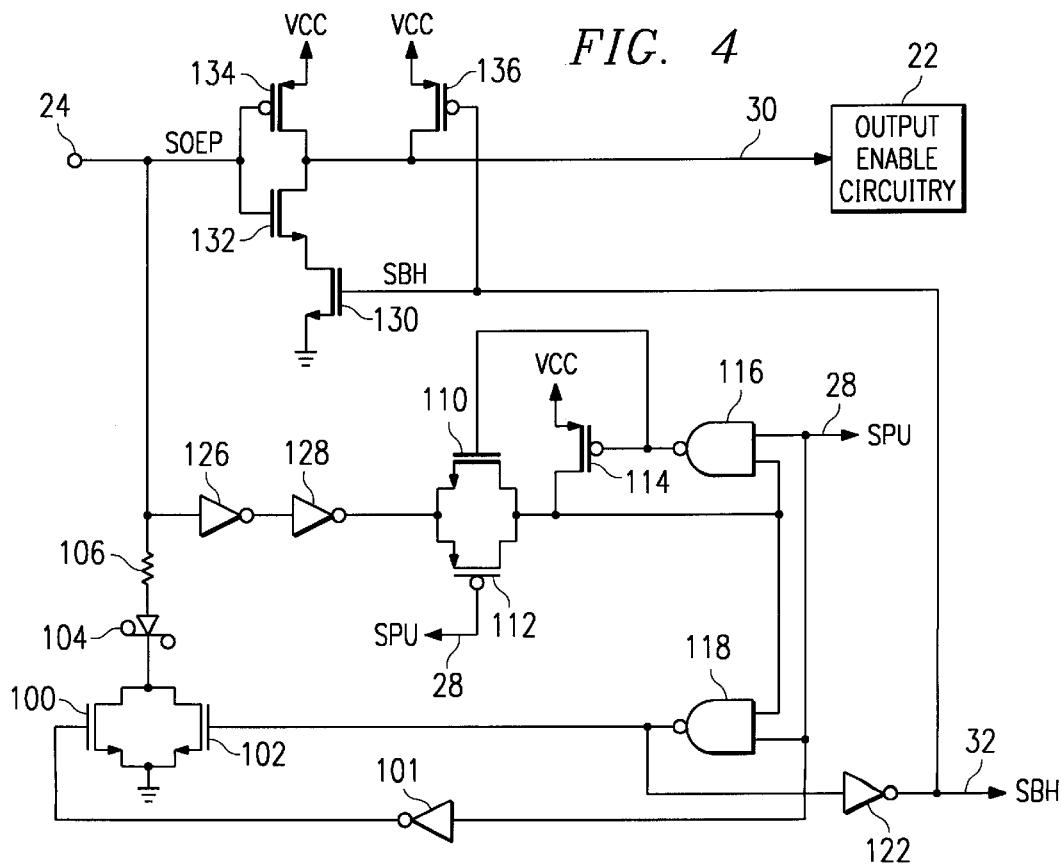
FIG. 4 illustrates a circuit diagram of an embodiment of the invention for biasing an active-high output enable control line.

The present invention can be used with integrated circuit designs having either an active-high output enable control or an active-low output enable control line. FIG. 2 is a circuit diagram of the biasing section 40, the latch section 42, the sensing section 46, and the signal input gate 50 for biasing an active-low output enable control line. FIG. 4 is a circuit diagram of the biasing section 40, the latch section 42, the sensing section 46, and the signal input gate 50 for biasing an active-high output enable control line.

With reference now to FIG. 2, a circuit diagram is shown with discrete components implementing the functions of FIG. 1 for biasing an active-low output enable control line. Referring both to FIG. 1 and FIG. 2, pull-up biasing section 40 is comprised of the parallel combination of P-channel transistors 60 and 62, diode 64, and resistor 66. The source of both transistors 62 and 66 are connected together and coupled to VCC. The drains of transistors 60 and 62 are connected together and coupled to the anode of diode 64, whose cathode is connected through resistor 66 to the output enable pin 24. Resistor 66 is provided so that the amount of current through either transistor 60 or 62 is controlled when diode 64 is forward biased. Diode 64 prevents reverse currents from flowing from output enable pin 24 into the drains of transistors 60 and 62 when diode 64 is reversed biased.

The gate of transistor 62 is coupled to the SPU signal 28, and the gate of transistor 32 is coupled to the SBH signal 60. When either of these are low, the respective transistor will conduct and the output enable signal line 24 will be pulled to a high signal level.

The strength of the pull-up biasing section 40 is staged through the use of transistors 60 and 62. Transistors 60 and 62 together are capable of providing sufficient current to charge the expected capacitive load present at the output enable pin 24, thereby pulling the output enable pin 24 high. When SPU signal 28 switches high, transistor 62 is disabled. In order to reduce the amount of current consumed by the pull-up biasing section 40, transistor 60 should be sized to sustain output enable pin 24 at a high logic level after transistors 60 and 62 have charged output enable pin 24 to the high logic level.

The latch section 42 (FIG. 1) is shown in FIG. 2 as having N-channel transistor 70, P-channel transistors 72 and 74, NAND gates 76 and 78, and inverter 82. Transistors 70 and 72 are connected in parallel with the gate of transistor 72 connected to the SPU signal 28. The gate of transistor 70 is connected to the output of NAND gate 76 and the gate of transistor 74. The source pins of both transistors 70 and 72 are connected to the S5 signal line 48 from inverter 86, while the drains of transistors 70 and 72 are connected to an input of NAND gates 76 and 78, labeled in FIG. 2 as the S6 signal 80. Transistor 74 connects the S6 signal 80 to VCC in response to the output of NAND gate 76.

Each of the NAND gates 76 and 78 have an input coupled to the SPU signal line 28. The output of NAND gate 78, shown as the S4 signal 44, is connected to the input of inverter 82 for providing the SBH signal 32, and is also coupled to the gates of transistors 90 and 96, described below.

Sensing section 46 (FIG. 1) is shown in FIG. 2 as inverter 86 with its input connected to the output enable pin 24. The output of inverter 86 provides the S5 signal 48 coupled to the source of both transistors 70 and 72.

The signal input gate 50 (FIG. 1) is shown in FIG. 2 as P-channel transistors 90 and 92, and N-channel transistors 94 and 96. Transistors 90 and 92 are connected in series with the source of transistor 90 connected to VCC. The transistors 94 and 96 are connected in parallel with both sources connected to ground, and both drains connected to the S1 signal line 30. The gates of transistors 92 and 94 are connected together and coupled to the output enable pin 24. The gates of transistors 90 and 96 are connected together and coupled to the S4 signal 44.

Transistors 90, 92, 94, and 96 act essentially as a two-input NOR gate with the S4 signal 44 and the SOEP signal 25 as inputs to the NOR gate, and the S1 signal 30 as the output of the NOR gate. In this manner, if either the S4 signal 44 or the SOEP signal 25 is at a high logic level, then the S1 signal 30 will be at a low logic level. The S1 signal 30 is coupled to the output enable circuitry 22.

More specifically, transistors 92 and 94 form an inverting input gate for the SOEP signal 25 present at output enable pin 24 or pulled-up by transistors 60 or 62. If the SOEP signal 25 is high, then the S1 signal 30 is pulled low through transistor 94. The S4 signal is a secondary fail-safe control for the S1 output signal 30. When the S4 signal is high, transistor 90 is disabled, thereby disabling transistor 92. Transistor 96 is enabled which pulls the S1 signal 30 low. Hence, both the SOEP signal 25 and the S4 signal 44 control the S1 output signal.

In operation, while the SPU signal 28 is low, transistor 62 will be turned on and will pull-up the SOEP signal 25. With the SPU signal 28 low, the outputs of the NAND gates 78 and 76, including the S4 signal 44, will be at high logic levels. This is because, in general, if either input to a NAND gate is low, the output will be high. The high logic level of the S4 signal 44 will drive the SBH signal 32 to a low logic level (the active level for the SBH signal) and hence transistor 60 will also be turned on. Both transistors 62 and 60 are now on and are charging the SOEP signal 25 at the output enable pin 24 high. As previously described, the pull-up process of the output enable pin 24 is staged so that the strength of the pull-up is efficiently maintained.

Since the SOEP signal 25 is high, transistor 94 will turn on and set the S1 signal 30 low which provides a disabled logic level to the output enable circuitry 22.

The high S4 signal 44 will also disable transistor 90, thereby also disabling transistor 92. The high S4 signal will also pull the S1 signal 30 low through transistor 96, thereby providing a disabled logic level to the output enable circuitry 22 to place the output of the integrated circuit in the high-impedance mode.

Since while SPU is low, VCC is ramping up, transistors 60 and 62 pull the output enable pin 24 to a high logic level, which roughly is the present value of VCC. The strength of transistors 60 and 62 should be sized to handle an external capacitive load of 50pF with VCC ramping at 2 $\mu$S/V. In order for the latch section 42 (FIG. 1) to properly latch the output enable pin to a high logical level, it is necessary that transistors 60 and 62 can pull-up a floating output enable pin 24 above the switching threshold of inverter 86 before VCC reaches the level at which the SPU signal 28 switches high.

Before the SPU signal 28 switches high, inverter 86 will sense a high logic level at its input (shown as the SOEP signal) and will drive the S5 signal 48 low. This low logic level on the S5 signal 48 will be passed through transistors 70 and 72, and drive the S6 signal 80 low. A low logic level on the S6 signal 80 will hold the outputs of the NAND gates 76 and 78, including the S4 signal 44, high after the SPU signal 28 switches high. Hence, the SBH signal will be latched to remain at its active low level until an external input drives the output enable pin 24 low.

When the SPU signal 28 goes high, transistor 62 will turn off, but transistor 60 will remain on to hold the output enable pin 24 high until it is externally driven low. This staged pull-up scheme also allows for the output enable pin 24 to be switched high with a fast ramp rate on VCC (i.e., approximately 2 $\mu$S/V), but the output enable pin 24 can then be easily externally driven low after the integrated circuit has been powered-up.

After the SPU signal 28 is high, if the output enable pin 24 is externally driven to a low logic level, the S5 signal 48 switches high. This signal transition is passed through transistor 70 and switches the S6 signal 80 high. Since the SPU signal 28 is already set high, the S4 signal output of NAND gate 78 switches low. This activates the transistor 90 so that the inverting signal gate formed by transistors 92 and 94 will operate to pass the externally applied signal from output enable pin 24 to the output enable circuitry 22.

The low logic level of the S4 signal also switches the SBH signal 32 high (inactive), which turns off transistor 60, disabling the pull-up biasing section of the present invention. When the S6 signal 80 went to a high logic level, it also switched the output signal of NAND gate 76 low (because the SPU signal is also high), turning transistor 70 off and transistor 74 on. With transistors 70 and 72 off and transistor 74 on, a high logic level is latched on the S6 signal 80 by transistor 74 such that the S4 signal will be securely kept low, releasing the S1 signal 30 controlled by transistor 96. The bias circuit 20 is thus removed from operation until needed again during subsequent power-up sequences of the integrated circuit.

If a low logic level is applied to the output enable pin 24 during power-up (i.e., before VCC reaches a level where the SPU signal goes high), the S5 signal 48 and the S6 signal 80 will be set high but the SPU signal 28 will be low until VCC ramps to a predetermined switching value. Transistors 60 and 62 will turn on until the SPU signal 28 switches high, and when SPU switches high, the SBH signal 32 will switch high (inactive), disabling transistors 60 and 62.

An alternate embodiment of the circuit of FIG. 2 will now be described. While FIG. 2 is shown with the fail-safe signal S4, it is understood that fail-safe signal S4 could be removed from the circuit of FIG. 2 by removing NAND gate 78, and transistors 90 and 96. The S4 signal to inverter 82 could be connected directly to the output of NAND gate 76, while the source of transistor 92 could be directly coupled to VCC. This alternate embodiment would operate substantially the same as the circuit shown in FIG. 2, except that the signal present at the gates of transistors 92 and 94 would be the only input to the signal input gate 50 (FIG. 1).

Figure 3:
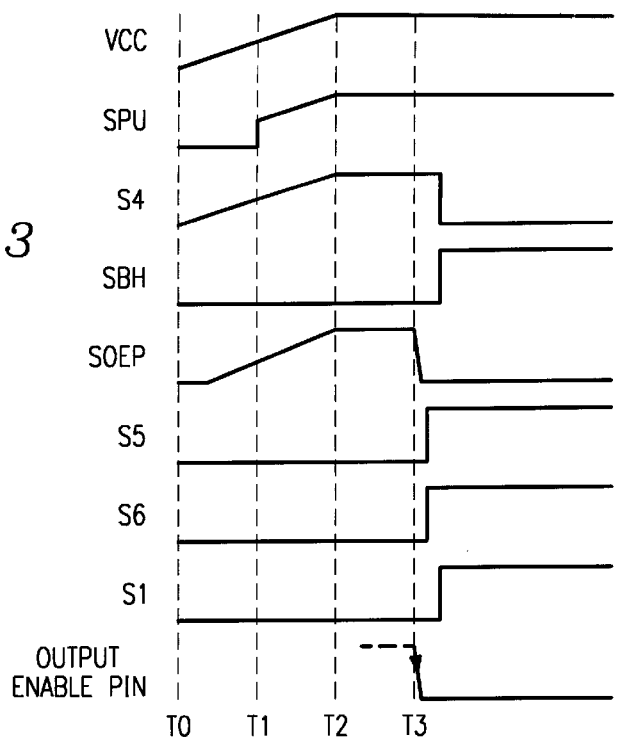
FIG. 3 illustrates a timing diagram of various signals shown in FIG. 2.

FIG. 3 is a timing diagram of the various signals shown and described with reference to FIG. 2, at times T0, T1, T2, and T3. T0 represents an initial condition wherein the circuit has yet to receive power, as the power signal VCC is at or about zero volts. The voltage level of VCC increases to its full value between times T0 and T2. As described above, when VCC reaches a predetermined switching value, shown as T1, the SPU signal also switches high to the VCC voltage level.

With reference to the timing diagram of FIG. 3 and also to FIG. 2, from time T0 to T1, since SPU is low, SOEP will be high after transistor 62 begins to conduct, and S4 is high through NAND gate 78. As SOEP is high, S5 will stay low through inverter 86, and S6 will also be low, which forces the outputs of the NAND gates 76 and 76 high. Since S4 is high, SBH will be low through inverter 82, and S1 will be low through transistor 96.

At time T1, SPU goes high. But since the S6 signal is low, the logical signal levels will remain unchanged as VCC ramps to its full value at T2. S4 and SOEP will remain logically high, and SBH, S5, S6, and S1 will remain low.

These states remain the same until time T3. Time T3 shows when the output enable pin is externally pulled low. The SOEP signal correspondingly also goes low, and the S5 signal goes high through inverter 86, which switches S6 high. The S4 signal goes from high to low, and therefore the SBH signal goes from low to high. Finally the SOEP signal is inverted through transistors 92 and 90 so that the S1 signal goes high.

Now referring to FIG. 4, an embodiment of the invention is shown for use in an integrated circuit having an active-high output enable control line. The biasing section 40 (FIG. 1) will initially pull down the output enable pin 24 through resistor 106, diode 104, and N-channel transistors 100 and 102. Inverter 101 inverts the SPU signal 28 applied to the gate of transistor 100. Transistors 100 and 102 are configured such that when either of them conducts, the output enable pin 24 is connected to ground.

The latch section 42 (FIG. 1) has N-channel transistor 110, P-channel transistors 112 and 114, NAND gates 116 and 118, and inverter 122. The latch section of FIG. 4 operates substantially in the same manner as the latch section previously described with reference to FIG. 2.

The sensing section 46 (FIG. 1) has inverters 126 and 128 in series connected between the output enable pin 24 and the source of both transistors 110 and 112.

The signal input gate 50 (FIG. 1) is implemented as a NAND gate in FIG. 4, having N-channel transistors 130 and 132, and P-channel transistors 134 and 136. The inputs to this NAND gate configuration are the output enable pin 24

(shown as SOEP) and the SBH signal 32. The output of the NAND gate configuration is high if either of the two inputs is low. The output of the NAND gate configuration is coupled to the output enable circuitry 22 of the integrated circuit.

It will be appreciated by one of ordinary skill in the art that the operation of the biasing circuit shown in FIG. 4 is substantially similar to the circuit shown and described with reference to FIG. 2, except that the circuit of FIG. 4 will pull-down the output enable pin 24. Beginning with the SPU signal being low at power-up, transistors 100 and 102 pull-down the SOEP signal of output enable 24. Since SPU is low, the SBH signal 32 will go low through NAND gate 118 and inverter 122, thereby activating transistor 136 to pull signal 30 high.

Sensing inverters 126 and 128 couple the pulled-down SOEP signal to the transistors 110 and 112 of the latch section. When the SPU signal 28 goes high after VCC reaches a predetermined switching value, the latch section maintains the SBH signal low. When an externally applied signal pulls the output enable pin 24 high, the SBH signal goes high (inactive), thereby permitting the SOEP signal, now high, to be passed through the inverting gate transistor 132 and 130. Signal 30 will now be low to activate the output enable circuitry 22.

Figure 5:
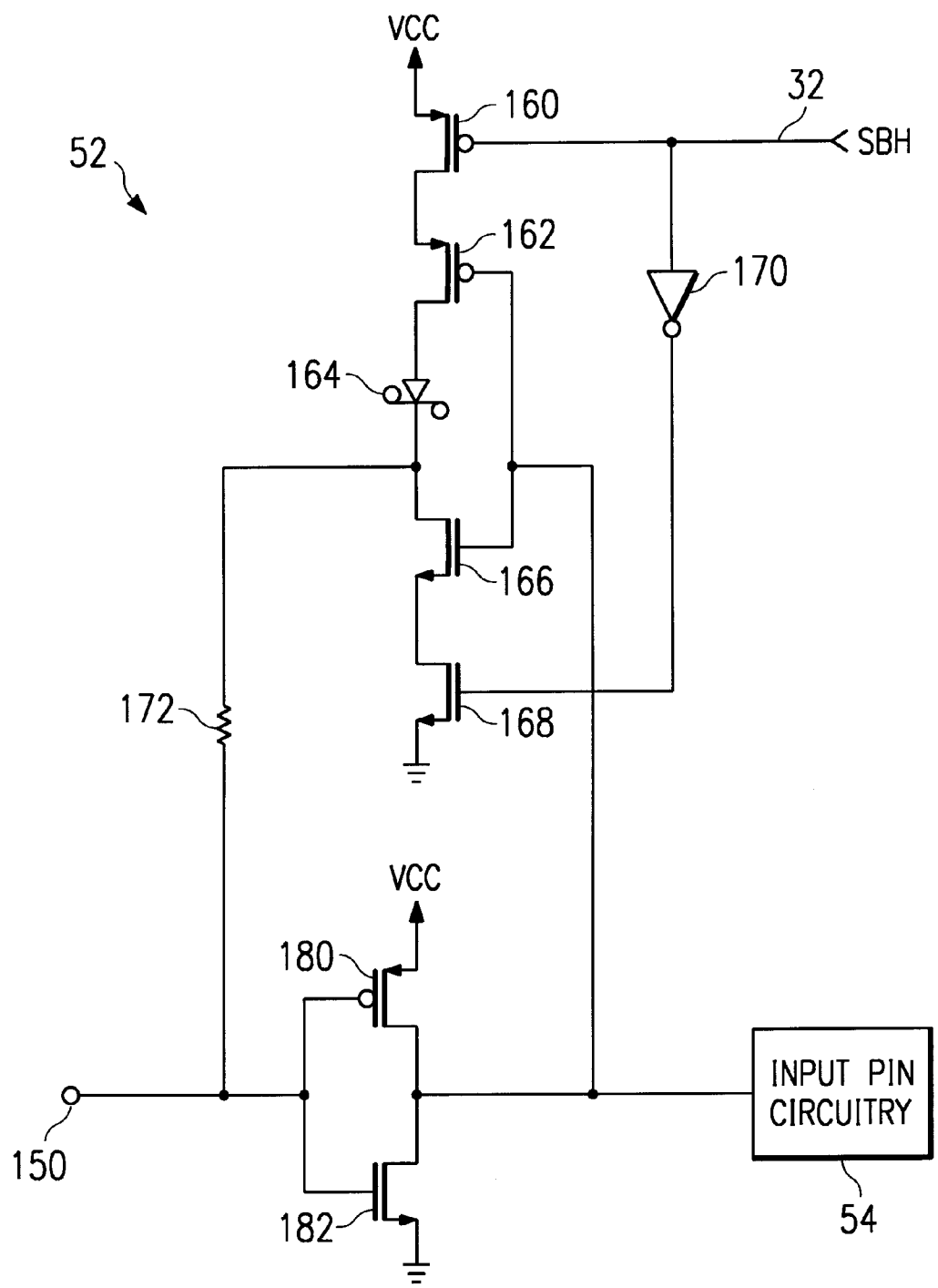
FIG. 5 is a circuit diagram of the bus hold circuit section 52 shown in FIG. 1 for biasing an input pin.

With reference now to FIG. 5, a circuit diagram is shown with discrete components implementing the bus hold section 52 shown in FIG. 1. The bus hold section can be used to bias an input pin of an integrated circuit to a fixed logic level during power-up. As previously discussed,. input pins to a CMOS integrated circuit should not be left "floating" or unbiased. The circuit of FIG. 5, when incorporated with an integrated circuit, permits a user of the integrated circuit to power it up without having to externally bias the input pins of the integrated circuit.

Referring to FIG. 5, the bus hold section 52 is coupled between an external input pin 150 and the input pin circuitry 54 of the integrated circuit. Regardless of the logic level of external input pin 150 (i.e., random signal levels if the input pin 150 is floating), the bus hold section 52 will bias the external input pin 150 to either a high or low level for coupling to the input pin circuitry 54.

The inputs to the bus hold section 52 include the SBH signal 32 and the VCC signal. The bus hold section 52 has a P-channel transistor 160 connected in series with a P-channel transistor 162. The drain of transistor 162 is coupled to the anode of diode 164. The cathode of the diode 164 is coupled to the external input pin 150 through resistor 172. The cathode of diode 164 is also coupled to the series combination of N-channel transistors 166 and 168, the source of transistor 168 being coupled to ground.

The gates of transistors 162 and 166 are coupled together, and the gate of transistor 168 is coupled to the SBH signal 32 through inverter 170. The SBH signal 32 is also coupled to the gate of transistor 160. The series combination of transistors 180 and 182 form an inverting input buffer which isolates external input pin 150 from the input pin circuitry 54.

In overall operation, the bus hold section 52 shown in FIG. 5 functions as follows. The SBH signal is an active-low signal. During power-up conditions, the SBH signal 32 is low and the bus hold section 52 will maintain the signal to the input pin circuitry 54 at a fixed high or low level. When the output enable pin 24 of FIG. 1 is externally activated, the SBH signal 32 goes high (inactive) which will effectively disconnect bus hold section 52 from the input pin circuitry 54. In this manner, the bus hold section 52 releases the input pin 150 when a signal is externally applied to the output enable pin 24.

When the SBH signal is low, transistors 160 and 168 are enabled. This establishes a high signal level at the source of transistor 162, and a low signal level at the source of transistor 166.

If the signal at external input pin 150 is high, then transistor 182 conducts and connects the gates of transistors 162 and 166 to ground. As a result, transistor 162 turns on thereby securely connecting the external input pin 150 to a logic high at VCC. Conversely, if the level of the external input pin 150 is low, then transistor 180 turns on and connects the gate of transistor 166 to VCC. Transistor 166 then turns on and securely maintains the external input pin 150, through resistor 172, at a logic low level.

When the SBH signal 32 goes high (inactive), the bus hold circuit 52 is disabled because transistors 160 and 168 are disabled and therefore no biasing signal is applied through resistor 172 to the gates of the inverting buffer transistors 180 and 182. As a result, only the signal level present at external input pin 150 affects the signal applied to input pin circuitry 54 through inverting buffer transistors 180 and 182

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A circuit for biasing a signal pin of an integrated circuit to a predetermined logic level during power-up of said integrated circuit, the circuit comprising:
   a biasing section, coupled to said signal pin, for connecting said signal pin to a supply signal of said integrated circuit so that a signal level of said signal pin approaches said predetermined logic level;
   a sensing section, coupled to said signal pin, for sensing said signal level of said signal pin;
   a latch section, coupled to said biasing section and said sensing section, for controlling said biasing section in response to the signal level of said signal pin; and
   wherein said biasing section has first and second current capacity modes, said first mode is for processing a first current level between said signal pin and said biasing section as said signal level of said signal pin approaches said predetermined logic level, and said second mode is for processing a second current level between said signal pin and said biasing section after said signal level of said signal pin has reached said predetermined logic level.

2. The circuit of claim 1, wherein said biasing section is coupled to and responsive to a power-up reference signal of said integrated circuit, said power-up reference signal being active when the supply signal reaches a predetermined voltage level, thereby activating said biasing section.

3. The circuit of claim 1, wherein said biasing section is comprised of a parallel pair of switching elements connected to said supply signal.

4. The circuit of claim 1, wherein said biasing section is comprised of a parallel pair of switching elements connected to a ground signal.

5. The circuit of claim 1 wherein said signal pin is an output enable pin of said integrated circuit.

6. A circuit for biasing a signal pin of an integrated circuit to a predetermined logic level during power-up of said integrated circuit, the circuit comprising:

a biasing section, coupled to said signal pin, for connecting said signal pin to a supply signal of said integrated circuit so that a signal level of said signal pin approaches said predetermined logic level;

a sensing section, coupled to said signal pin, for sensing said signal level of said signal pin;

a latch section, coupled to said biasing section and said sensing section, for controlling said biasing section in response to the signal level of said signal pin;

wherein said biasing section is comprised of a parallel pair of switching elements connected to said supply signal; and wherein a first switching element of said pair of switching elements has a current capacity greater than a second switching element of said pair of switching elements.

7. A circuit for biasing a signal pin of an integrated circuit to a predetermined logic level during power-up of said integrated circuit, the circuit comprising:

a biasing section, coupled to said signal pin, for connecting said signal pin to a supply signal of said integrated circuit so that a signal level of said signal pin approaches said predetermined logic level;

a sensing section, coupled to said signal pin, for sensing said signal level of said signal pin;

a latch section, coupled to said biasing section and said sensing section, for controlling said biasing section in response to the signal level of said signal pin;

wherein said sensing section detects an external signal applied to said signal pin and directs said latch section to release said signal pin from said supply signal through said biasing section.

8. A circuit for biasing a signal pin of an integrated circuit to a predetermined logic level during power-up of said integrated circuit, the circuit comprising:

a biasing section, coupled to said signal pin, for connecting said signal pin to a supply signal of said integrated circuit so that a signal level of said signal pin approaches said predetermined logic level;

a sensing section, coupled to said signal pin, for sensing said signal level of said signal pin;

a latch section, coupled to said biasing section and said sensing section, for controlling said biasing section in response to the signal level of said signal pin;

a bus hold section coupled to said latch section for applying a fixed logic signal level to another pin of said integrated circuit until said sensing section detects an external signal applied to said signal pin.

9. A method for biasing a signal pin of an integrated circuit to a predetermined logic level during power-up of said integrated circuit, the method comprising:

connecting said signal pin to a supply signal of said integrated circuit so that a signal level of said signal pin approaches said predetermined logic level;

sensing said signal level of said signal pin;

controlling said connecting step in response to the signal level of said signal pin sensed by said sensing step;

wherein said connecting step further comprises firstly coupling said supply signal through a first switching element for processing a first current level between said signal pin and a biasing section as said signal level of said signal pin approaches said predetermined logic level; and wherein said connecting step further comprises secondly coupling said supply signal through a second switching element for processing a second current level between said signal pin and said biasing section after said signal level of said signal pin has reached said predetermined logic level.

10. A method for biasing a signal pin of an integrated circuit to a predetermined logic level during power-up of said integrated circuit, the method comprising:

connecting said signal pin to a supply signal of said integrated circuit so that a signal level of said signal pin approaches said predetermined logic level;

sensing said signal level of said signal pin;

controlling said connecting step in response to the signal level of said signal pin sensed by said sensing step; and wherein said controlling step further comprises detecting when an external signal is applied to said signal pin; and disconnecting said signal pin from said supply signal in response to said detecting step.

11. A method for biasing a signal pin of an integrated circuit to a predetermined logic level during power-up of said integrated circuit, the method comprising:

connecting said signal pin to a supply signal of said integrated circuit so that a signal level of said signal pin approaches said predetermined logic level;

sensing said signal level of said signal pin;

controlling said connecting step in response to the signal level of said signal pin sensed by said sensing step;

providing a power-up reference signal being active when the supply signal reaches a predetermined voltage level; and releasing said signal pin from said supply signal of said integrated circuit after said power-up reference signal is active and an external signal applied to said signal pin is sensed by said sensing step.

\* \* \* \* \*